(12) United States Patent
Mahawili et al.

(10) Patent No.: US 6,310,323 B1
(45) Date of Patent: Oct. 30, 2001

(54) WATER COOLED SUPPORT FOR LAMPS AND RAPID THERMAL PROCESSING CHAMBER

(75) Inventors: Imad Mahawili, Grand Rapids; John M. Arend, Belmont, both of MI (US)

(73) Assignee: Micro C Technologies, Inc., Kentwood, MI (US)

( * ) Notice: Subject to any disclaimer, the term of this patent is extended or adjusted under 35 U.S.C. 154(b) by 0 days.

(21) Appl. No.: 09/535,928

(22) Filed: Mar. 24, 2000

(51) Int. Cl.⁷ ........................................................ F27B 5/14
(52) U.S. Cl. ........................ 219/390; 219/411; 219/405; 118/724; 118/725; 118/50.1; 392/416; 392/418
(58) Field of Search ..................... 219/390, 405, 219/411; 118/724, 725, 50.1; 392/416, 418

(56) References Cited

U.S. PATENT DOCUMENTS

| | | | |
|---|---|---|---|
| 3,626,154 | 12/1971 | Reed | 219/411 |
| 3,836,751 | 9/1974 | Anderson | 219/411 |
| 4,540,876 | * 9/1985 | McGinty | 219/405 |
| 4,550,684 | 11/1985 | Mahawili | 118/724 |
| 4,558,660 | 12/1985 | Nishizawa et al. | 118/725 |
| 4,592,307 | 6/1986 | Jolly | 118/719 |
| 4,680,447 | 7/1987 | Mahawili | 219/343 |
| 4,680,451 | 7/1987 | Gat et al. | 219/411 |
| 4,748,135 | 5/1988 | Frijlink | 437/102 |
| 4,834,022 | 5/1989 | Mahawili | 118/725 |
| 4,993,358 | 2/1991 | Mahawili | 118/715 |
| 5,049,726 | 9/1991 | Higgins et al. | 219/464 |
| 5,155,336 | 10/1992 | Gronet et al. | 219/411 |
| 5,310,260 | 5/1994 | Schietinger et al. | 374/142 |
| 5,317,492 | 5/1994 | Gronet et al. | 362/294 |
| 5,366,002 | 11/1994 | Tepman | 165/1 |
| 5,382,805 | 1/1995 | Fannon et al. | 250/304 |
| 5,446,825 | 8/1995 | Moslehi et al. | 392/416 |
| 5,453,124 | 9/1995 | Moslehi et al. | 118/715 |
| 5,487,127 | 1/1996 | Gronet et al. | 392/416 |
| 5,490,728 | 2/1996 | Schietinger et al. | 374/7 |
| 5,525,160 | 6/1996 | Tanaka et al. | 118/728 |
| 5,531,835 | 7/1996 | Fodor et al. | 118/728 |
| 5,551,985 | 9/1996 | Brors et al. | 118/725 |
| 5,566,744 | 10/1996 | Tepman | 165/80.1 |
| 5,603,772 | 2/1997 | Ide | 118/724 |
| 5,951,896 | * 9/1999 | Mahawili | 219/411 |

FOREIGN PATENT DOCUMENTS

| | | |
|---|---|---|
| 664058A5 | 1/1988 | (CH) . |
| 3908600A1 | 9/1990 | (DE) . |
| 1544551 | 4/1979 | (GB) . |

* cited by examiner

*Primary Examiner*—Teresa Walberg
*Assistant Examiner*—Shawntina Fuqua
(74) *Attorney, Agent, or Firm*—Van Dyke, Gardner, Linn & Burkhart, LLP

(57) ABSTRACT

A heating assembly for heating a semiconductor substrate in a processing chamber of a reactor includes a plurality of heater supports and a plurality of heating devices supported by the heater supports. The heater supports provide conductive paths for the heating devices for coupling the heating devices to an external power source and, further, are adapted to cool the heating devices whereby the heating devices may be operated at a high power output while maintaining the temperature of the heating devices below a maximum temperature. Preferably the heater supports are cooled by a coolant system, for example a coolant system which circulates coolant through at least a portion of the heater supports to thereby cool the heater supports and the heating devices.

53 Claims, 8 Drawing Sheets

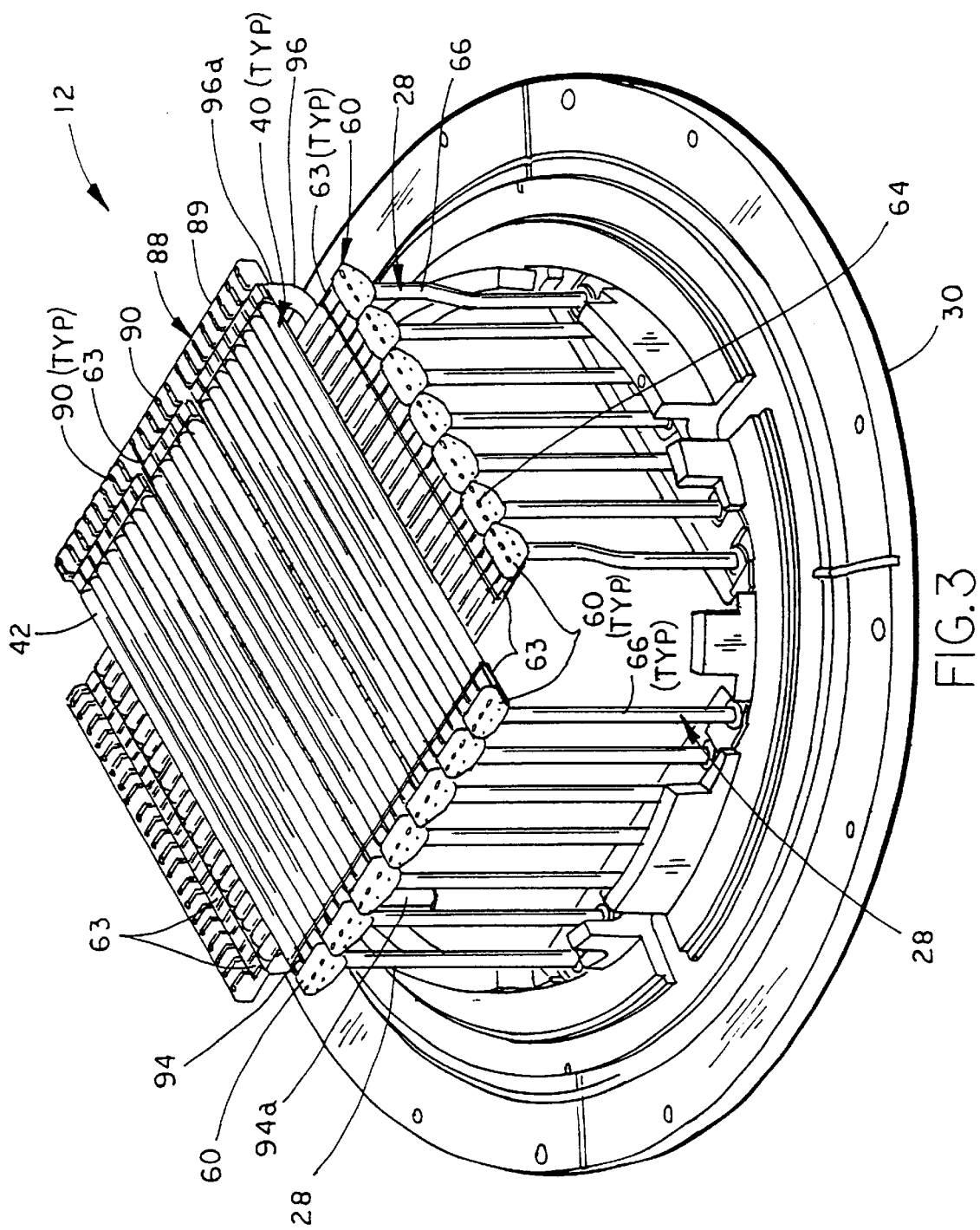

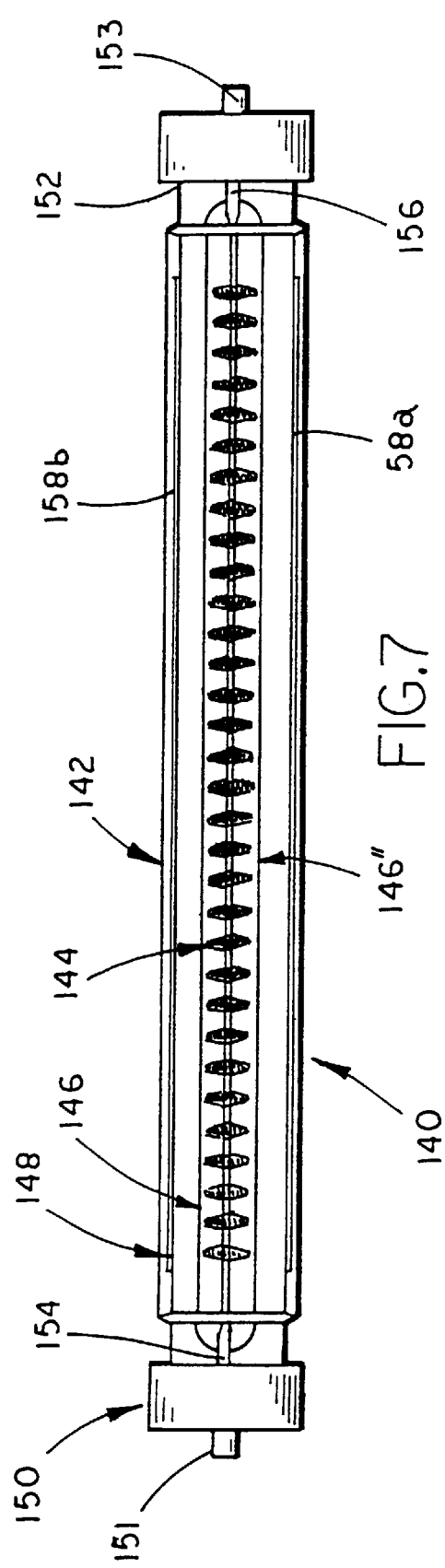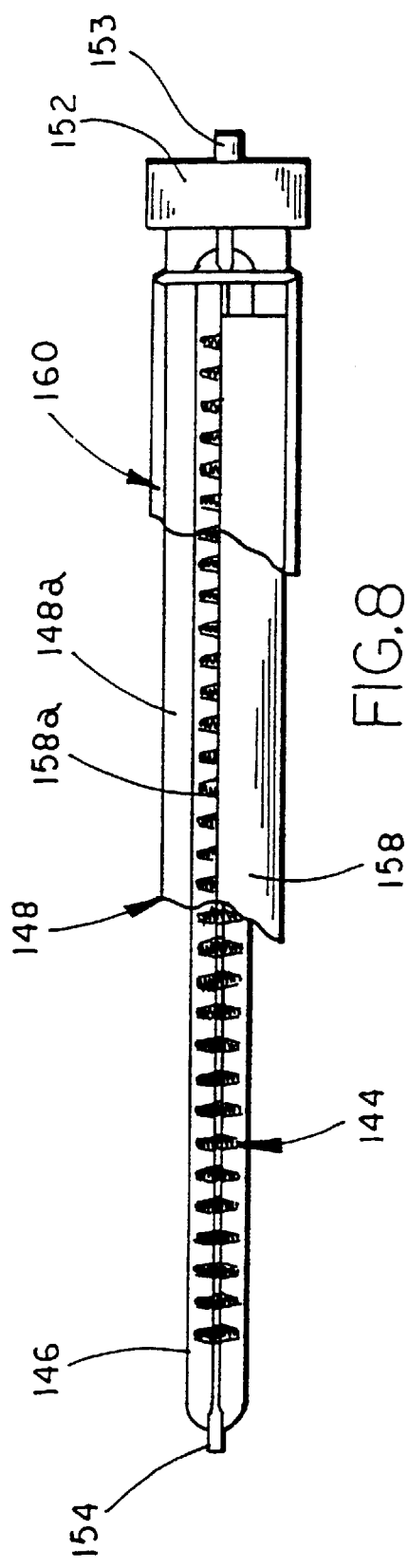

WATER COOLED SUPPORT FOR LAMPS AND RAPID THERMAL PROCESSING CHAMBER

TECHNICAL FIELD AND BACKGROUND OF THE INVENTION

The present invention generally relates to a rapid thermal heating apparatus for heating substrates and, more particularly, to a heating apparatus for heating semiconductor substrates in an evacuated processing chamber.

In semiconductor fabrication, a semiconductor substrate is heated during various temperature activity processes, for example during film deposition, oxide growth and etching. Temperatures associated with processing semiconductor substrates are relatively high, for example typically in a range of about 400° C. to 1150° C.

When heating the substrate, it is preferable to heat the substrate uniformly. Uniform temperature in the substrate provides uniform process variables on the substrate. Uniformity in the process variables is also affected by gas flow uniformity across the substrate. Reduced pressure in the processing chamber also provides enhanced control over the gas flow across the substrate. Therefore, it is highly often desirable to operate these various processes in a reduced pressure environment.

However, when operating in vacuums, heat transfer by convection is effectively zero and heat dissipation is typically limited to heat transfer by conduction and radiation. As a result, in some cases, heaters may not be able to sustain an optimal power output for a given process and, further, may suffer degradation due to the limited heat dissipation. As a result, the performance of heaters is hampered and, further, may have reduced longevity.

Consequently, there is a need for a heater assembly which can operate in vacuum, such as in a processing chamber of a reactor for a processing semiconductor control over the temperature of the substrate and, further, without degrading the heater assembly itself.

SUMMARY OF THE INVENTION

Accordingly, the present invention provides a heating assembly for use in rapid thermal processing of semiconductor substrates that can provide a sustained optimal power output while exercising enhanced control over the temperature of a substrate without degrading the heater assembly even while operating in a vacuum.

In one form of the invention, a heating assembly for heating semiconductor substrates includes a plurality of heater supports and a plurality of heating devices. The heating devices are supported by the heater supports, which are adapted to the heating devices whereby the heating devices may be operated to produce a high powered output while maintaining the temperature of the heating devices below a maximum threshold level.

In one aspect, the heating devices comprise infrared heating devices. For example, each of the heating devices may comprise an infrared energy emitting filament and a housing which encloses the filament. The filament includes electrodes extending from the housing for electrically coupling to an external power supply.

In further aspects, the electrodes of the heating devices are supported by the heater supports. In preferred form, the heater supports comprise fluid cooled heater supports. For example, the heating assembly preferably includes a fluid coolant system, which circulates coolant through at least a portion of the heater supports to thereby cool the heating devices.

According to another form of the invention, a heating assembly for heating a semiconductor substrate in a processing chamber of a reactor includes a plurality of heater supports and a plurality of heating devices, which are supported by the heater supports. The heater supports provide conductive paths for the heating devices for coupling the heating devices to an external power source and, further, are adapted to cool the heating devices whereby the heating devices may be operated at a high power output while maintaining the temperature of the heating devices below a maximum threshold level.

In one aspect, each of the heater supports is cooled by a coolant system. In other aspects, each of the heating devices includes a pair of electrodes. Each of the heater supports includes at least one electrode support which couples to the electrodes of the heating devices to support the heating devices. In further aspects, the electrode supports are adapted to cool the heating devices. In other aspects, each of the heater supports includes a tubular member which is coupled to a respective electrode support. The tubular members are adapted to cool the electrode supports to cool the heating devices. For example, the tubular members may be in communication with a cooling system, which cools the tubular members. In preferred form, the cooling system includes a manifold, which circulates coolant through at least a portion of the tubular members thereby cooling the tubular members, the electrode supports, and the heating devices.

In other aspects, the electrode supports comprise conductive electrode supports, which provide conductive paths for the heating devices for electrically coupling the heating devices to an external power supply. In further forms, tubular members comprise conductive tubular members, which provide conductive paths for the heating devices for electrically coupling the heating devices to an external power supply.

According to another form of the invention, a semiconductor substrate is heated by a plurality of heating devices which are energized to produce a power output and, further, which are cooled whereby the heating devices may be energized to produce an increased power output while maintaining the temperature of the heating devices below a maximum threshold level to optimize the heating of the semiconductor substrate.

In one aspect, the electrodes of the heating devices are supported by supports, which are cooled to cool the electrodes of the heating devices. In further aspects, the supports are cooled by circulating a coolant through at least a portion of the supports, for example by circulating water.

In other aspects, the heating devices are energized by energizing the electrodes of the heating devices through the supports.

These and other objects, features, and advantages will become more apparent from the study of the drawings and description which follows.

DESCRIPTION OF THE DRAWINGS

FIG. 3 is a perspective view of the heater assembly of FIG. 2;

FIG. 7 is a plan view of a lamp of the heater assembly of FIG. 6; and

FIG. 8 is a partial fragmentary view of the lamp of FIG. 7.

DETAILED DESCRIPTION OF THE PREFERRED EMBODIMENTS

Figure 1:
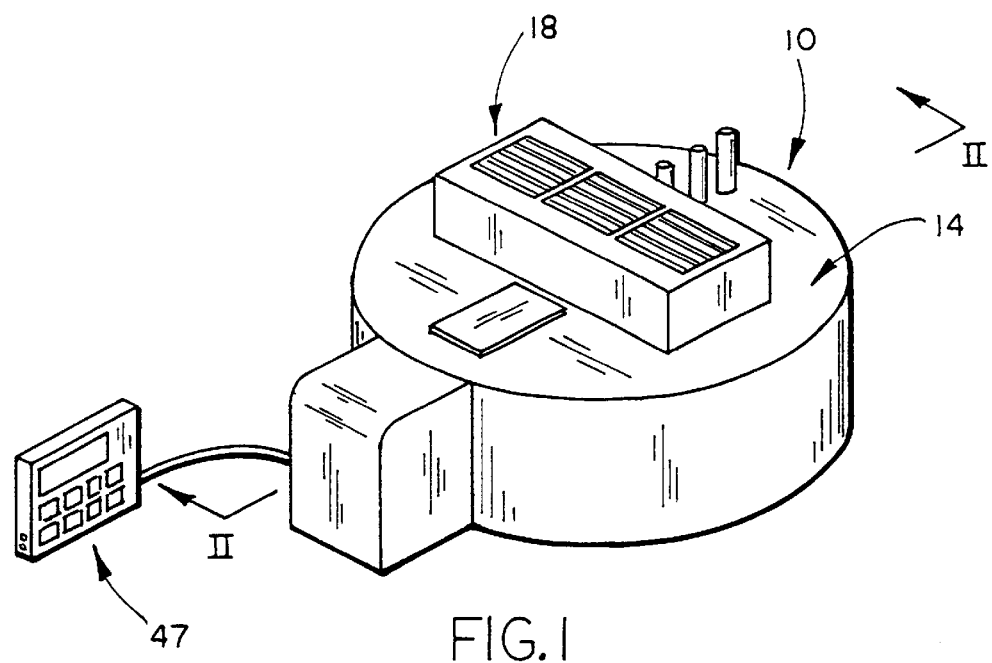
FIG. 1 is a perspective view of a reactor incorporating a heater assembly of the present invention.
Figure 4:
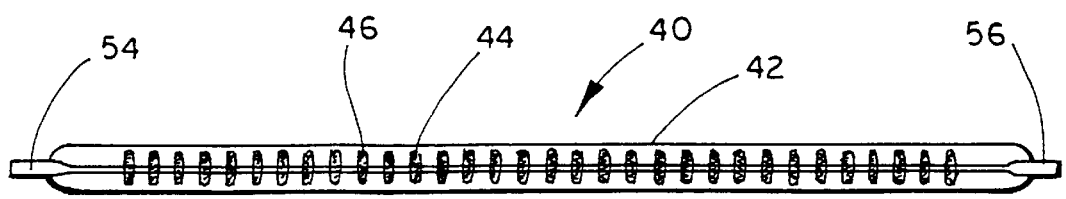
FIG. 4 is an enlarged plan view of a lamp of the heater assembly of FIG. 3.

Referring to FIG. 1, the numeral 10 generally designates a reactor incorporating a heater assembly 12 (FIG. 3) of the present invention, which is especially suited for processing semiconductor substrates. Heater assembly 12 includes a plurality of heating devices 26 and is adapted to uniformly heat a substrate 24 positioned in reactor 10 with the heating devices and, further, is adapted to cool heating devices 26 by dissipating the heat from the respective heating devices 26 through an enhanced heat transfer system of the present invention. In this manner, heater assembly 12 may be operated in a manner to optimize its power output to enhance the processing of semiconductor substrate 24 while maintaining temperatures below a maximum threshold level so that heater assembly 12 can operate more efficiently in a reduced pressure environment, such as in a vacuum.

Figure 2:
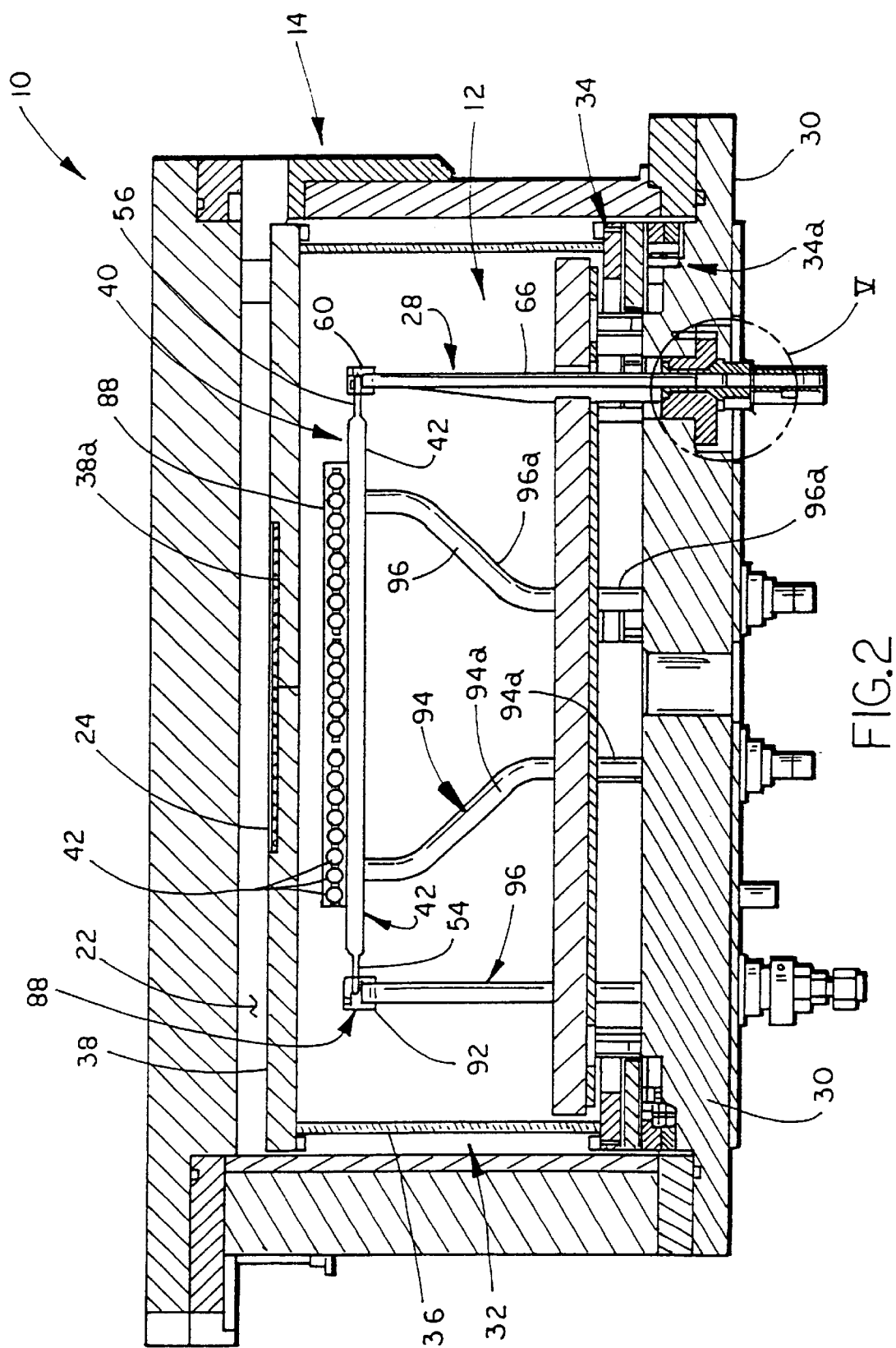
FIG. 2 is a cross-section taken along line II—II of FIG. 1.

Referring to FIG. 2, reactor 10 includes a reactor housing 14 which define a processing chamber 22 and a gas injection system 18, which is used to inject one or more gases including reactant gases into processing chamber 22. Heater assembly 12 is supported on a base 30 of housing 14 and, further, is positioned in a second or heater housing 32, which is rotatably supported on base 30 of reactor housing 14. Heater housing 32 includes a base 34, which is rotatably supported on base 30 of housing 14, and a cylindrical wall 36. Base 34 is driven by a conventional magnetically coupled drive mechanism 34a. Supported on cylindrical wall 36 of heater housing 32 is a platform 38, which rotatably supports substrate 24 in processing chamber 22. Substrate 24 is preferably supported on a recessed support surface 38a of platform 38. Thus, when heater housing 32 and base 34 are rotated, platform 38 rotates substrate 24. For further details of suitable platforms, reference is made to U.S. Pat. No. 6,007,635, and U.S. copending applications Ser. No. 08/912,242, filed Aug. 15, 1997, entitled SUBSTRATE PLATFORM FOR A SEMICONDUCTOR SUBSTRATE DURING RAPID HIGH TEMPERATURE PROCESSING AND METHOD OF SUPPORTING A SUBSTRATE, now U.S. Pat. No. 6,090,212 (Attorney Docket MIC04 P-102), and Ser. No. 09/419,555, filed Oct. 18, 1999, entitled PLATFORM FOR SUPPORTING A SEMICONDUCTOR SUBSTRATE AND METHOD OF SUPPORTING A SUBSTRATE DURING RAPID HIGH TEMPERATURE PROCESSING, the disclosures of which are herein incorporated by reference in their entireties.

Heating devices 40 preferably comprise linear lamps 42, for example T3 Tungsten Halogen Lamps such as lamps specified at one kilowatt at 120 voltage alternating current (VAC), which are commercially available from GTE Sylvania or other lamp manufacturers. Lamp 42 generally comprises an energy emitting filament 44 which is enclosed in a tubular housing 46. Filament 44 preferably comprises an infrared energy emitting filament and, more preferably, a short wave emitter having a wave length of about 0.9 microns to 2.3 microns. Housing 46 preferably comprises a tubular member of transparent energy transmitting material that houses and encloses the filament and preferably transmits energy corresponding to the wavelength of filament 44. Suitable transparent energy transmitting materials include quartz, silica, sapphire, or the like. In the illustrated embodiment, filament 44 comprises a helically coiled wire filament, such as an incandescent helically coiled tungsten wire filament, and includes electrodes 54 and 56 at its opposed ends which project outwardly from housing 46 for coupling to a power supply, as will be more fully described below. Filament 44 is generally coaxial with tubular element 46 and extends along a longitudinal extent of the tubular member 44.

As best seen in FIGS. 2 and 3, lamps 42 are generally arranged in two groups, with one group being arranged in a first plane spaced above base 30 at a first distance and with a second group being spaced above base 30 a second, greater distance. Lamps 44 are generally uniformly spaced across their respective planes and, further, are supported at their free ends by heater supports 28 and 88. As will be more fully described below, supports 28 and 88 are adapted to transfer heat from lamps 44 in order to dissipate the heat generated by lamps 44 when energized and, further, to transfer heat from lamps 44 by conduction and convection.

Figure 5:
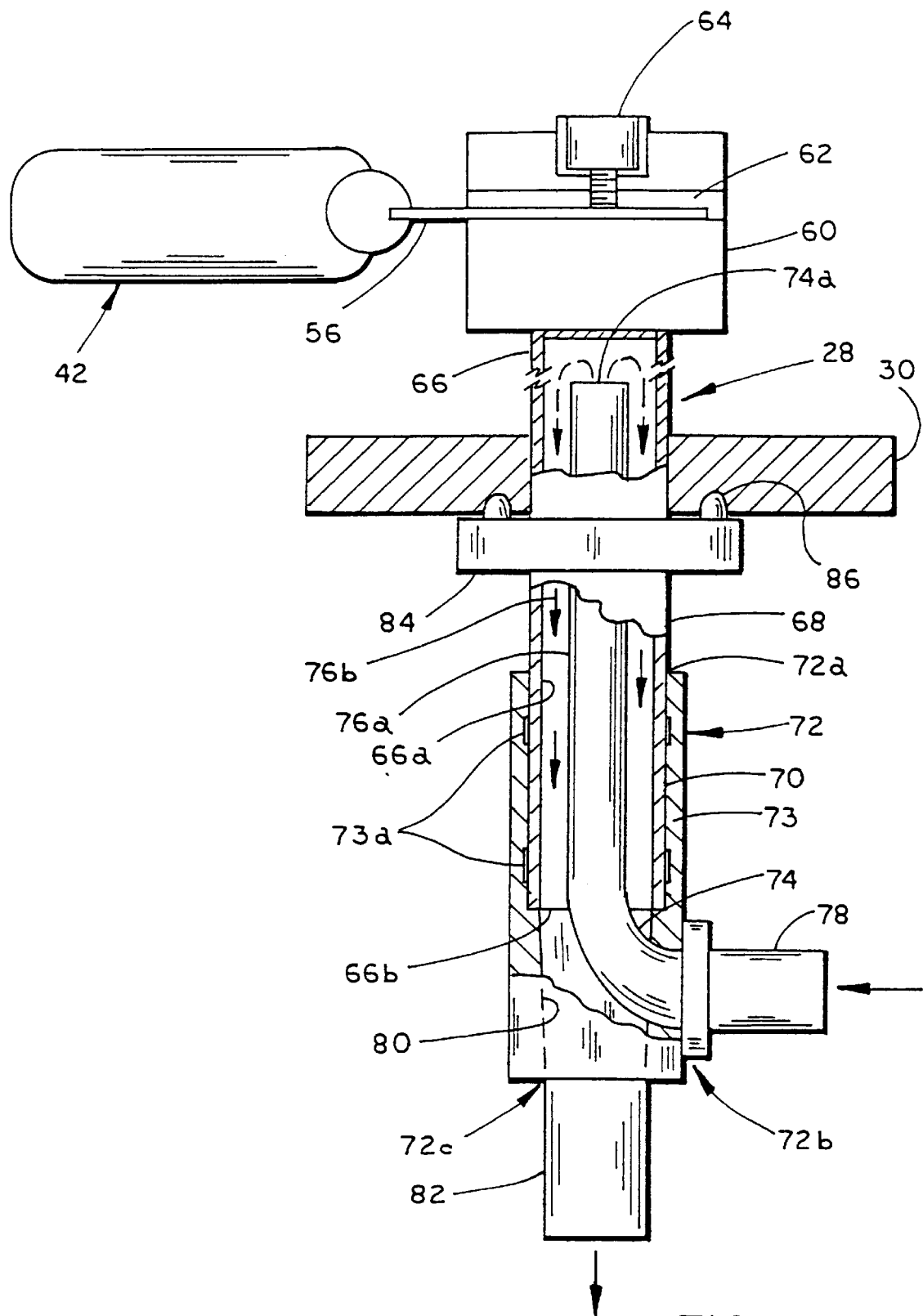
FIG. 5 is an enlarged view of section V of FIG. 2 illustrating the mounting arrangement of a lamp of the heater assembly on a water cooled support of the present invention.

As best seen in FIGS. 3 and 5, each support 28 includes an electrode support 60. Electrode support 60 preferably comprises a body formed from conductive material, such as nickel plated copper, and includes a plurality of sockets 62 for receiving a respective plurality of electrodes 56 of lamps 42. In order to assure good contact between electrodes 56 and electrode support 60, electrode support 60 includes a corresponding plurality of holders 64 which urge electrodes 56 into electrical contact with electrode support 60. For example, holders 64 may comprise screws, spring biased pins, or the like. In addition, each electrode support 60 includes a bracket 63 which engages the tubular housing of the respective lamps supported by electrode support 60 to provide support to the housings of lamps 42. It should be understood, a single holder may be used to urge the respective plurality of electrodes into electrical contact with the respective electrode support and, further, a single ganged bracket may be used to hold the respective housing 46 of lamps 42.

Each support 28 further includes a tubular member 66 which extends from its respective electrode support 60 through base 30 of housing 14 for coupling to an external power supply, which coupled to extended end portion 68 of tubular member 66, and further for coupling to a coolant system, described below. Projecting through base 30 is an elongated end portion 68 of tubular member 66. End portion 68 includes an open ended distal end 70 which extends into and is supported in a manifold 72, preferably formed from a non-conductive material. Manifold 72 includes a body 73 with a first inlet passage 72a, for receiving and supporting distal end 70 of support tubular member 66, and a second inlet passage 72b for receiving a coolant feed line 74. Feed line 74 is preferably non-conductive and extends into tubular member 66 through inlet 72b and open ended distal end 70. For example, feed line 74 may comprise nylon tubing, polypropylene tubing, or the like. Manifold body 73 includes contacts 73a positioned in passage 72a which are electrically coupled to an external power supply for electrically coupling support tubular member 66 to the external power supply, which in turn electrically couples electrode supports 60 and electrodes 56 to the external power supply. Manifold 72 further includes an outlet 72c which is in fluid communication with a coolant exit or discharge line 82 through a passage 80 formed in body 73. Line 82 is also preferably non-conductive, such as nylon, polypropylene or the like. Preferably, feed line 74 has a smaller outer diameter than the inside diameter of tubular member 66 so that when coolant is injected into feed line 74, the coolant which flows through feed line 74, as indicated by arrow 76a, is injected into tubular member 66. The coolant then flows between the space defined between feed line 74 and the inside surface 66a of tubular member 66 as indicated by arrows 76b to be discharged through passage 80 and then into coolant discharge line 82. It should be understood, that coolant enters and flows through feed line 74 and exits from open end 74a of feed 74 line and thereafter disperses in tubular member 66 to cool tubular member 66 by conduction and convention and, further, to cool electrode support 60 by way of conduction through the interface between tubular member 66 and electrode support 60. For example, tubular member 66 is preferably welded to electrode support 60. After the coolant is dispersed from outlet 76a of feed line 66, the coolant flows down through tubular member 66 to the outlet 66b of tubular member 66 through passageway 80 and then through outlet line 82 for discharge or for recirculation as will be understood by those skilled in the art. By circulating fluid through supports 28, the temperature of heating devices 40 can be maintained below a maximum desired threshold level. In preferred form, the coolant comprises water, but it should be understood that other coolants may be used and, further, that the rate of cooling is a function of the rate of circulation and of the heat capacity of the coolant fluid. In this manner, electrode supports and, therefore, electrodes 56 are cooled by a combination of conduction, convention, and radiation but in a manner that is not affected by the reduced pressure in chamber 22.

In order to maintain the vacuum in processing chamber, tubular member 66 extends through base 30 through an electrode vacuum feed-through 84 which includes a seal 86, such as an elastomeric ring, to seal tubular member 66 to base 30.

Referring again to FIG. 3, the ground electrode 54 of the respective lamps 42 may be supported in a common or ganged heater support 88. Support 88 includes a unitary electrode support body 89, preferably formed from a conductive material, such as nickel plated copper. Body 89 includes a plurality of sockets 91 for receiving the respective electrodes 54 of lamps 42. Body 89 includes a corresponding plurality of holders 90 which secure the respective electrodes 54 to conductive body 89 of support 88 to assure proper electrical contact between electrodes 54 and body 89. Support 88 further includes a pair of support members 94 and 96 which support body 89 above base 30 and, further, as will be more fully described, cool body 89 to thereby cool heating devices 40. Support members 94 and 96 are preferably conductive tubular members 94a and 96a and are electrically coupled to body 89 so that body and support members 94 and 96 provide an electrically conductive ground path for heating devices 40, as will be more fully described below. Similar to tubular members 66, tubular members 94a and 96a of supports 94 and 96, respectively, extend through base 30 of housing 14 for positioning in a similar manifold to manifold 72 so that coolant can be circulated through at least a portion of supports 94 and 96.

Preferably, supports 28, 94 and 96 are adapted to cool the respective lamp electrode ends and to maintain the temperature of the respective lamps below a preferred maximum temperature of about 200° C. to 350° C. Preferably, heater assembly 12 produces a power output of 20 to 100 kilowatts with a maximum temperature of less than about 350° C, more preferably, less than 300° C. and, most preferably less than 200° C.

Figure 5A:
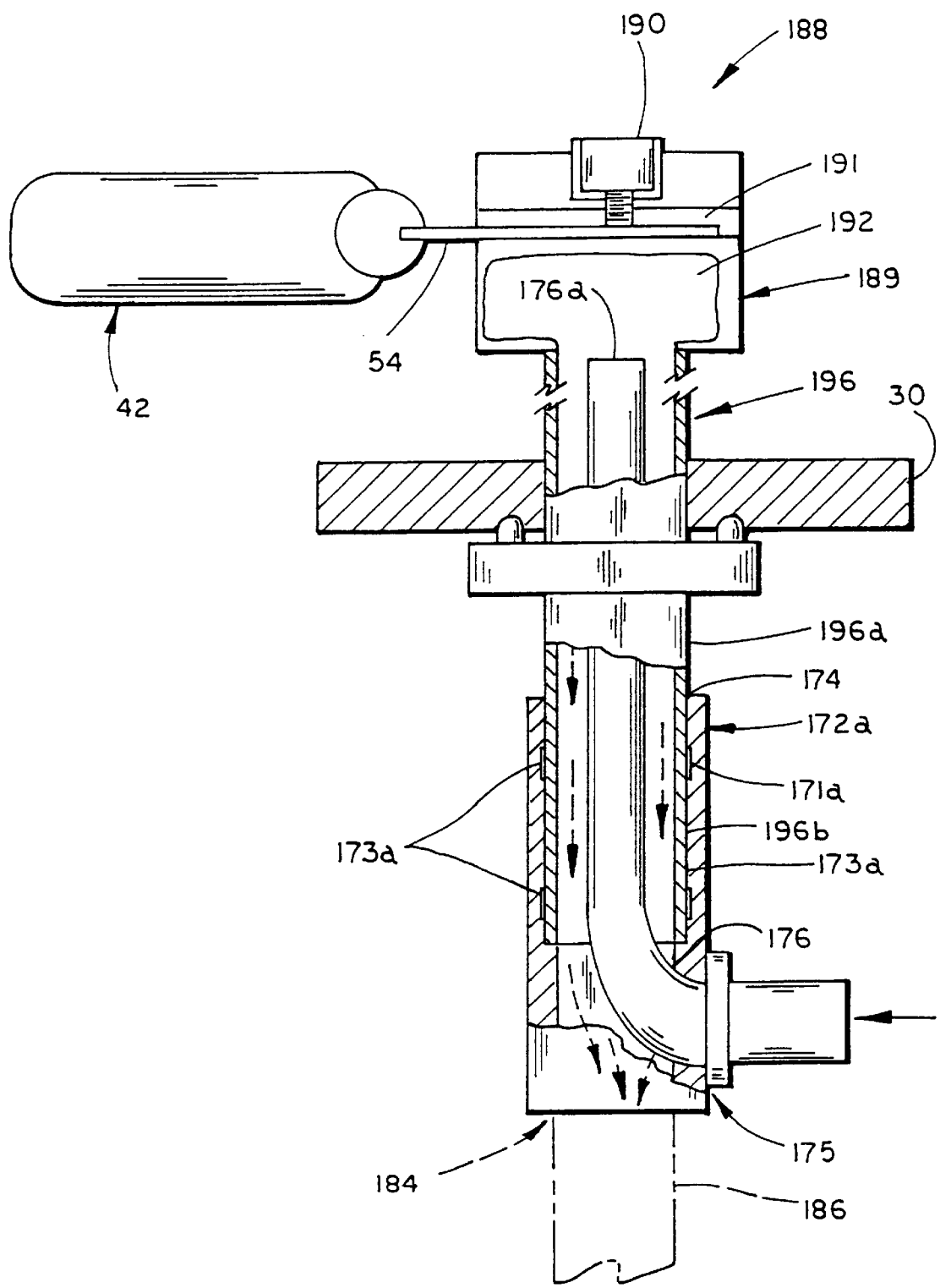
FIGS. 5A and 5B are an enlarged section view similar to FIG. 5 illustrating second embodiment of a heater support of the present invention.

Referring to FIG. 5A, a second embodiment 188 of heater support of the present invention is illustrated. Heater support 188 is of similar construction to heater support 88 and comprises a common or ganged heater support which includes a unitary electrode support body 189. Body 189 is preferably formed from a conductive material similar to body 89, and includes a plurality of sockets 191 for receiving the respective electrodes 54 of lamps 42. Body 189 includes a corresponding plurality of holders 190 which electrically couple the respective electrodes 54 to the conductive body 189 of support 188. Support 188 further includes a pair of support members 194 and 196 similar to support members 94 and 96, which support and space unitary body 189 from base 30. Each support member 194, 196 includes an elongated tubular member 194a and 196a, respectively. Tubular members 194a and 196a extend through base 30 to couple to a coolant system described below. In addition, similar to support members 94 and 96, support members 194 and 196 are preferably formed from conductive tubular members and provide a ground path for the respective electrodes 54 of lamps 42.

As best seen in FIG. 5A, tubular member 196a extends into a manifold 172a. Body 173a of manifold 172a includes an inlet passage 174 for receiving the open ended distal end 196b of tubular member 196a and a second inlet passage 175 which received a coolant feed line 176 for circulating coolant through supports 194 and 196 and body 189, which will be more fully described below. Inlet passage 174 includes a plurality of electrical contacts 171a which are electrically coupled to a ground path to thereby provide a conductive path for the respective electrodes 54 through body 189 and through tubular member 196a. Feed line 176 enters tubular member 196a through open ended distal end 196b and extends upwardly into tubular member 196a such that the outlet 176a of feed line 176 injects coolant into tubular member 196a. In the illustrated embodiment, body 189 includes a transverse passageway 192, which is in fluid communication with the elongate passageway of tubular member 196a. Preferably, when coolant is injected into tubular member 196a, it is injected with sufficient pressure to direct the flow of coolant through passageway 192 to discharge through tubular member 194a, as will be more fully described.

Figure 5B:
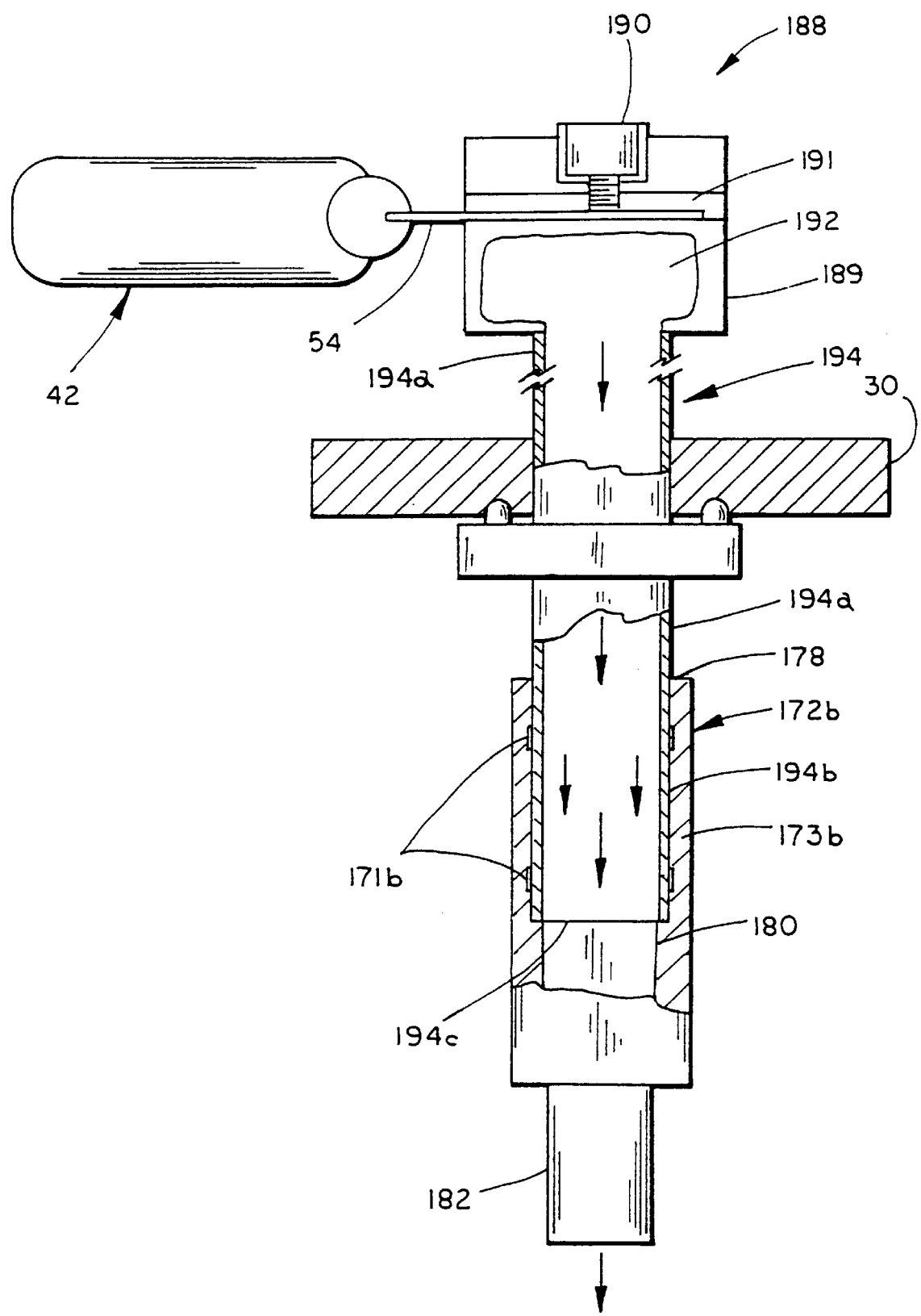
Figure 6:
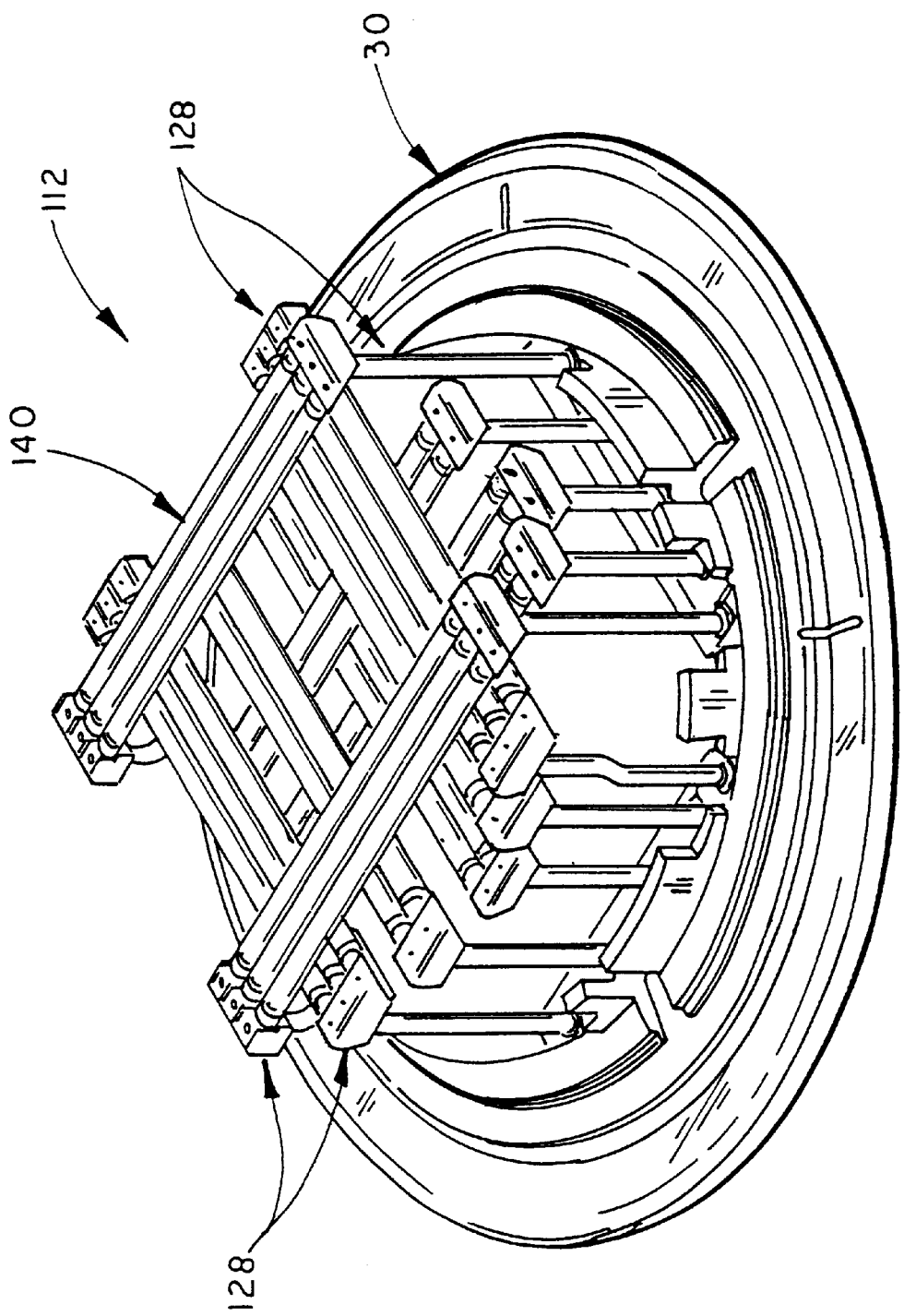
FIG. 6 is a perspective view of a second embodiment of the heater assembly of FIG. 3.

Referring to FIG. 5B, support member 194 similarly includes a tubular member 194a which extends through base 30 into a second manifold 172b. Second manifold 172b provides for the discharge of coolant from supports 194 and 196. Manifold 172b includes a body 173b with an inlet passage 178, which receives open ended distal end portion 194b of tubular member 194a. In addition, manifold body 173b includes an outlet passageway 180 which is in fluid communication with open end 194c of distal end 194b and, further, with a discharge line 182 which discharges the coolant from heater support 188. Similar to manifold 172a, manifold 172b includes a plurality of contacts 171b, which provide a conductive path for tubular member 194a, body 198, and electrodes 154 to ground. In this manner, lamps 142 include a second ground path by way of unitary body 189, tubular member 194a and manifold 172b.

It should be understood that manifold 172a may optionally include an outlet passage 184 (FIG. 5A), which permits discharge from tubular member 196a to a second discharge line 186 in order to enhance the cooling of tubular member 196. It can be appreciated, that the flow of coolant from feed line 176 through tubular member 196, to elongated passage 192, and then through tubular member 194 provides an enhanced cooling system which transfers heat from electrodes 54 by a combination of conduction, convection, and radiation. Furthermore, it is noted in reference to the previous embodiment, the rate of heat transfer can be increased or decreased by increasing the flow of coolant and/or by adjusting the thermal conductivity of the coolant. In addition, the rate of heat transfer can be increased by varying the properties or configurations of the supports. In preferred form, the coolant comprises water; however, it can be appreciated that other coolant fluids may be used, for example water/ethylene glycol mixture, pure ethylene glycol or the like.

It can be appreciated from the foregoing, that the present heater support assembly comprise a heat sink which dissipates or removes heat from the respective heating devices of the heater assembly. By providing a fluid cooled heat sink, the rate of heat transfer can be controlled by the flow of coolant fluid and, furthermore, by the temperature of the coolant fluid that is injected into the inlet of the respective supports as will be understood by those skilled in the art.

Referring to FIG. 7, a second embodiment of heater assembly 112 is illustrated. Heater assembly 112 includes a plurality of heating devices 140 which are supported in a tiered arrangement by a plurality of heater supports 128 to provide a variable heat profile to substrate 24 during processing. Similar to the previous embodiment, heater supports 128 incorporate an enhanced heat transfer system whereby the heat generated by heater assembly 112 may be controlled in such a manner to optimize the power output of the respective heating device 140 while maintaining the temperature of the heating devices below a maximum threshold level so that heater assembly 112 can operate efficiently in a vacuum environment, such as processing chamber 22.

Heating devices 140 preferably include linear lamps 142, such as T3 Tungsten Halogen Lamp specified at 1–2 kilowatts or higher at 120 voltage alternating current (VAC), which is commercially available from GTE Sylvania or other lamp manufacturers. Each lamp 142 includes an energy emitting filament 144 which is housed in an elongated tubular member 146 of transparent energy transmitting material, and, preferably, energy transmitting material that transmits energy corresponding to the wave length of filament 144. Similar to the previous embodiment, filament 144 preferably comprises an infrared energy emitting filament, more preferably, a short wave emitter having a wave length of about 0.9 microns to 2.3 microns. Suitable material for tubular member 146 includes quartz, silica, sapphire or the like. Optionally, tubular member 146 may be enclosed in a second tubular member 148 and supported in tubular member 148 by a pair of end caps 150 and 152. Second tubular member 148 preferably is also formed from an energy transmitting material, such as quartz, silica, sapphire or the like. Insulating caps 150 or 152 preferably comprise an insulating material, such as alumina, mica, or the like may be used. Each end cap 150, 152 includes an electrode 151 and 153, which are respectively coupled to electrodes 154 and 156 of filament 144 and which project outwardly from tubular member 146. Electrodes 151 and 153 project outwardly from end caps 150 and 152, respectively, to permit coupling of the heating device to an external power supply, as will be more fully described below in reference to heater supports 128. Optionally, outer surface 148a of second tubular member 148 may include a reflector layer 158, such as a thin coat of gold. Reflective layer 158 directs the heat emitted from filament 144 through a window which is defined between opposed free edges 158a and 158b of reflective layer 158. Where reflective layer, such as a reflective layer 158 is provided, reflective layer is preferably encapsulated by a third tubular member 160, which is welded at its opposed free ends to second tubular member 148 to thereby encapsulate reflective layer in the lamp assembly. For further details of a reflector coated lamp assembly, reference is made to U.S. Pat. No. 5,951,896, which is commonly assigned to Micro C Technologies, Inc. of Grand Rapids, Mich., the disclosure of which is herein incorporated by reference in its entirety.

Similar to the previous embodiment, heater assembly 112 includes a plurality of supports 128 which support heating devices 140 in their graduated tiered arrangement. Supports 128 are of similar construction to supports 28 and, therefore, reference is made to the first embodiment for further details. However, given the tiered support arrangement of heating devices 140, a ganged heater support, such as support 88, may not be as advantageous.

In the preferred embodiments described herein, heating assemblies 12 and 112 are described in relation to heating a semiconductor substrate. While heater assembly 12 and 112 have particular usefulness in heating semiconductor material, the use is not so limited. In addition, while several forms of the invention have been shown and described, other modifications will become apparent to those skilled in the art. For example, the number of heating devices may be increased or decreased and, further, the number of tiers, for example in the second embodiment of heater assembly 112 may be varied. In addition, the electrode supports and tubular members may be formed from other suitable conductive material, such as nickel, copper, stainless steel, silver or the like, and assume different configurations, as would be understood by those skilled in the art. In addition, as noted, the coolant fluid may comprise water or other suitable coolant fluids. While the preferred embodiments of heater assemblies 12 and 112 have been described in reference to reactor 10, heater assemblies 12, 112 may be used in other reactors. In addition, though not described, reactor 10 may include other features such as the emissivity measuring system disclosed in U.S. Pat. No. 5,814,365, the disclosure of which is incorporated by reference herein in its entirety. It is to be understood that this is a description of the preferred embodiments, and that one skilled in the art will recognize that additional features, improvement and embodiments may be made without departing from the scope of the invention disclosed herein. The scope of protection afforded is to be determined by the claims which follow and the breadth of the interpretation that Pat. law allows.

We claim:

1. A heating assembly for heating a semiconductor substrate, said heating assembly comprising:
   a plurality of heater supports; and
   a plurality of heating devices supported by said heater supports, said heater supports adapted to cool said heating devices whereby said heating devices may be operated to produce a high power output while maintaining the temperature of said heating devices below a maximum temperature.

2. The heating assembly according to claim 1, wherein said heating devices comprise infrared heating devices.

3. The heating assembly according to claim 1, wherein each of said heating devices comprises an energy emitting filament and a housing enclosing said filament, said filament including electrodes extending from said housing for electrically coupling to an external power supply.

4. The heating assembly according to claim 3, wherein said heater supports support said electrodes of said heating devices.

5. The heating assembly according to claim 4, wherein said heater supports comprise fluid cooled heater supports.

6. The heating assembly according to claim 5, further comprising a coolant system, said coolant system circulating coolant through at least a portion of said heater supports.

7. The heating assembly according to claim 1, wherein each of said heater supports supports a plurality of said heating devices.

8. The heating assembly according to claim 1, wherein said plurality of heating devices are arranged in at least two groups of heating devices.

9. The heating assembly according to claim 8, wherein at least one of said heater supports comprises a gang support, said gang support providing support for one of said groups of heating devices.

10. A heating assembly for heating a semiconductor substrate in a processing chamber of a reactor, said heating assembly comprising:
 a plurality of heater supports; and
 a plurality of heating devices supported by said heater supports, said heater supports providing conductive paths for said heating devices for coupling said heating devices to an external power supply and, further, being adapted to cool said heating devices whereby said heating devices may be operated at a high power output while maintaining the temperature of the heating devices below a maximum temperature.

11. The heating assembly according to claim 10, wherein each of said heater supports is cooled by a coolant system whereby said heater supports and said heating devices are cooled below said maximum temperature.

12. The heating assembly according to claim 10, wherein each of said heating devices includes a pair of electrodes, said heater supports including at least one electrode support, said electrode supports coupling to said electrodes of said heating devices to support said heating devices and, further, for electrically coupling said heating devices to the external power supply.

13. A heating assembly for heating a semiconductor substrate in a processing chamber of a reactor, said heating assembly comprising:
 a plurality of heater supports; and
 a plurality of heating devices supported by said heater supports, each of said heating devices including a pair of electrodes, said heater supports including at least one electrode support, said electrode supports coupling to said electrodes of said heating devices to support said heating devices, said heater supports providing conductive paths for said heating devices for coupling said heating devices to an external power supply and, further, said electrode supports being adapted to cool said heating devices whereby said heating devices may be operated at a high power output while maintaining the temperature of the heating devices below a maximum temperature.

14. The heating assembly according to claim 13, wherein each of said heater supports includes a tubular member, said tubular members coupled to said electrode supports, and said tubular members being adapted to cool said electrode supports to cool said heating devices.

15. The heating assembly according to claim 14, wherein said tubular members are in communication with a cooling system, said cooling system circulating coolant through at least a portion of said tubular members to thereby cool said tubular members, said electrode supports, and said heating devices.

16. The heating assembly according to claim 15, wherein said cooling system includes a manifold for each of said tubular members, said manifolds including inlet passages and outlet passages in fluid communication with said portions of said tubular members for circulating coolant through said portion of said tubular members.

17. The heating assembly according to claim 12, wherein said electrode supports comprise conductive electrode supports and provide conductive paths for said heating devices for electrically coupling said heating devices to the external power supply.

18. A heating assembly for heating a semiconductor substrate in a processing chamber of a reactor, said heating assembly comprising:
 a plurality of heater supports; and
 a plurality of heating devices supported by said heater supports, each of said heating devices including a pair of electrodes, said heater supports including at least one electrode support, said electrode supports coupling to said electrodes of said heating devices to support said heating devices, said heater supports providing conductive paths for said heating devices for coupling said heating devices to an external power supply and, further, being adapted to cool said heating devices whereby said heating devices may be operated at a high power output while maintaining the temperature of the heating devices below a maximum temperature, said electrode supports comprising conductive electrode supports and providing conductive paths for said heating devices for electrically coupling said heating devices to the external power supply, said heater supports comprising conductive tubular members, said tubular members providing conductive paths for said electrode supports and said heating devices for electrically coupling said heating devices to the external power supply.

19. The heating assembly according to 10, wherein said heating devices comprise infrared heating elements.

20. The heating assembly according to claim 19, wherein each of said heating elements comprises an energy emitting filament producing infrared energy when electrically coupled to the external supply and a housing enclosing said filament, said filament including a pair of electrodes extending from said housing for coupling to the external power supply, and said electrodes supported by said heater supports.

21. The heating assembly according to claim 10, wherein each of said heating devices comprises an energy emitting filament adapted for electrically coupling to an external power supply;
 a first enclosure housing said heating element, said enclosure being comprised of energy transmitting material;
 a second enclosure housing said first enclosure, said second enclosure being comprised of energy transmitting material;
 a reflective coating on an outer surface of said second enclosure for reflecting the energy generated by said filament when said filament is energized by the external power supply; and
 a third enclosure housing said second enclosure, said third enclosure being comprised of energy transmitting material and encapsulating said reflective coating so that when said energy emitting filament is energized, particles comprising said reflective coating are contained in said heating device.

22. A method of heating a semiconductor substrate, said method comprising:
 providing a processing chamber;

providing a plurality of heating devices;

supporting the plurality of heating devices in the processing chamber by a plurality of heater supports;

providing a semiconductor substrate;

energizing said heating devices to produce a power output;

cooling the heater supports;

contacting the heating devices with the heater supports; and cooling the heating devices with the heater supports whereby the heating devices may be energized to produce the power output while maintaining the temperature of the heating devices below a maximum temperature to optimize the heating of the semiconductor substrate.

23. The method of heating according to claim 22, wherein said providing a plurality of heating devices includes providing a plurality of heating devices having a pair of electrodes, further comprising cooling the electrodes to cool said heating devices.

24. The method of heating according to claim 23, wherein said supporting the plurality of heating devices includes supporting the electrodes of the heating devices by the plurality of supports; and wherein cooling the supports includes cooling the electrodes of said heating devices.

25. The method of heating according to claim 24, wherein cooling the supports includes circulating a coolant through at least a portion of the supports.

26. The method of heating according to claim 25, wherein said circulating a coolant includes circulating water.

27. The method of heating according to claim 23, wherein energizing includes energizing the electrodes of the heating devices through the supports.

28. The method of heating according to claim 22, further comprising supporting a first group of the heating devices in a first arrangement to form a first heating zone disposed to heat a first region of the semiconductor substrates; and supporting a second group of heating devices in a second arrangement to form a second heating zone disposed to heat a second region of the semiconductor substrate.

29. The heating assembly according to claim 13, wherein said heating devices comprise infrared heating devices.

30. The heating assembly according to claim 13, wherein at least one of said heater supports supports a plurality of said heating devices.

31. A substrate processing apparatus comprising:

a housing defining a processing chamber and being adapted to support a substrate therein; and a heating assembly according to claim 13, said heating assembly for heating the substrate in said processing chamber.

32. The heating assembly according to claim 18, wherein said heating devices comprise infrared heating devices.

33. The heating assembly according to claim 18, wherein said heater supports comprise fluid cooled heater supports.

34. The heating assembly according to claim 18, further comprising a coolant system, said coolant system circulating coolant through at least a portion of said heater supports.

35. The heating assembly according to claim 18, wherein at least one of said heater supports supports a plurality of said heating devices.

36. A heating assembly for heating a semiconductor substrate, said heating assembly comprising:

a heating device; and a heater support contacting and supporting said heating device, said heater support being adapted to couple said heating device to an external power supply and, further, being adapted to cool said heating device whereby said heating device may be operated to produce a high power output while maintaining the temperature of said heating device below a maximum temperature.

37. The heating assembly according to claim 36, wherein said heating device comprises an infrared heating device.

38. The heating assembly according to claim 36, wherein said heating device comprises an energy emitting filament and a housing including said filament, said filament including electrodes extending from said housing for electrically coupling to an external power supply.

39. The heating assembly according to claim 38, wherein said heater support contacts and supports said electrodes of said heating device, said heater support providing a conductive path for said heating device for coupling said heating device to an external power supply.

40. The heating assembly according to claim 36, wherein said heater support has a transverse passage extending through at least a portion of said heater support, said transverse passage being adapted to receive a circulating coolant for cooling said heater support to thereby cool said heating device associated with said heater support.

41. The heating assembly according to claim 40, further comprising a coolant system, said coolant system circulating coolant fluid through said portion of said heater support.

42. The heating assembly according to claim 36, wherein said heater support comprises a fluid cooled heater support.

43. The heating assembly according to claim 36, wherein said heating device comprises a plurality of said heating devices.

44. The heating assembly according to claim 43, wherein said heater support comprises a plurality of heater supports, each of heater support supports at least one of said heating devices.

45. The heating assembly according to claim 43, wherein said plurality of heating devices are arranged in at least two groups of heating devices.

46. A substrate processing apparatus comprising:

a housing defining a processing chamber and being adapted for supporting a semiconductor substrate therein; and a heating assembly according to claim 36, said heating assembly for heating the substrate in said processing chamber.

47. A substrate processing apparatus, comprising:

a heater support; and a heating device supported by said heater support, said heater support adapted to cool said heating device whereby the temperature of said heating device is allowed to be maintained below a maximum temperature.

48. The substrate processing apparatus according to claim 47, wherein said heater support supports an electrode of said heating device.

49. The substrate processing apparatus according to claim 47, wherein coolant is circulated through at least a portion of said heater support.

50. The substrate processing apparatus according to claim 47, wherein said heater support provides a conductive path for said heating device for coupling said heating device to an external power source.

51. The substrate processing apparatus according to claim 47, wherein said heating device includes a plurality of heating devices having a pair of electrodes, and said electrodes are cooled to cool said heating devices.

52. A method of heating a substrate, comprising:

providing a processing chamber;

providing a heating device;

supporting the heating device in the processing chamber;

providing a substrate;

supporting the substrate in the processing chamber;

energizing said heating device to produce a power output; and cooling the heating device whereby the heating device may be energized to produce the power output while maintaining the temperature of the heating device below a maximum temperature to heat the substrate.

53. A method of manufacturing a semiconductor device, comprising:

providing a processing chamber;

providing a heating device;

supporting the heating device in the processing chamber;

providing a substrate;

supporting the substrate in the processing chamber;

energizing said heating device to produce a power output; and cooling the heating device whereby the heating device may be energized to produce the power output while maintaining the temperature of the heating device below a maximum temperature to heat the substrate for processing said substrate.

* * * * *